United States Patent
Karpov et al.

(10) Patent No.: US 9,536,606 B2
(45) Date of Patent: Jan. 3, 2017

(54) SEASONING PHASE CHANGE MEMORIES

(71) Applicant: Ovonyx, Inc., Sterling Heights, MI (US)

(72) Inventors: Ilya V. Karpov, Santa Clara, CA (US); Semyon D. Savransky, Newark, CA (US); Ward D. Parkinson, Boise, ID (US)

(73) Assignee: Ovonyx Memory Technology, LLC, Alexandria, VA (US)

( * ) Notice: Subject to any disclaimer, the term of this patent is extended or adjusted under 35 U.S.C. 154(b) by 10 days.

(21) Appl. No.: 14/533,341

(22) Filed: Nov. 5, 2014

(65) Prior Publication Data

US 2015/0055409 A1    Feb. 26, 2015

Related U.S. Application Data

(62) Division of application No. 12/082,181, filed on Apr. 9, 2008, now abandoned.

(51) Int. Cl.
  *G11C 11/00* (2006.01)
  *G11C 13/00* (2006.01)

(52) U.S. Cl.
  CPC ....... *G11C 13/0069* (2013.01); *G11C 13/0004* (2013.01); *G11C 13/0061* (2013.01); *G11C 2013/009* (2013.01); *G11C 2013/0092* (2013.01); *G11C 2213/77* (2013.01)

(58) Field of Classification Search
  CPC ...................................................... G11C 11/00
  USPC .......... 365/46, 94, 100, 113, 129, 148, 163; 257/2–5, 9, 296, E31.047, E27.006; 438/29, 95, 96, 166, 259, 365, 482, 486, 438/597; 977/754
  See application file for complete search history.

(56) References Cited

U.S. PATENT DOCUMENTS 5,296,716 A * 3/1994 Ovshinsky et al. .............. 257/3
6,795,338 B2 * 9/2004 Parkinson et al. ............ 365/163
2007/0247899 A1 * 10/2007 Gordon et al. ............... 365/163

OTHER PUBLICATIONS

J. Sarkar and B. Gleixner, "Evolution of phase change memory characteristics with operating cycles," Appl. Phys. Lett., vol. 91, p. 233506, Dec. 6, 2007.*
C. C Zambelli, A. Chimenton, and P. Olivo, "Experimental characterization of SET seasoning on Phase Change Memory arrays," 2010 IEEE International Memory Workshop, pp. 1-4, May 16, 2010.*
Sarkar, J., et al., "Evolution of Phase Change Memory Characteristics with Operating Cycles: Electrical Characterization and Physical Modeling," Applied Physics Letters, Letter 91, 233507, (2007), 3 pages.
Zambelli, C., et al., "Experimental Characterization of SET Seasoning on Phase Change Memory Arrays," IEEE, Memory Workshop (IMW) 2010 IEEE International, 4 pages.

* cited by examiner

*Primary Examiner* — Harry W Byrne
(74) *Attorney, Agent, or Firm* — Kevin L. Bray

(57) ABSTRACT

A seasoned phase change memory has been subjected to a longer pulse to adjust resistance levels prior to use of the phase change memory.

22 Claims, 2 Drawing Sheets

SEASONING PHASE CHANGE MEMORIES

CROSS-REFERENCE TO RELATED APPLICATIONS

This application is a divisional of U.S. patent application Ser. No. 12/082,181, filed on Apr. 9, 2008.

BACKGROUND

This relates generally to phase change memories.

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

DETAILED DESCRIPTION

Seasoning effects in phase change memories relate to the tendency of the memories to require a few dozen cycles to become stable and to achieve their predetermined set and reset programming values. As manufactured, the devices may not exhibit the resistance associated with the set or crystalline state or the reset or amorphous state as designed. In addition, across an entire array, the distribution of set and reset resistances may be different from what is expected.

This is particularly so in memories which include ovonic threshold switches. An ovonic threshold switch uses a chalcogenide material which remains in its amorphous state. It may be used as an access device for an ovonic unified memory that has a chalcogenide layer that changes between amorphous and crystalline phases.

In order to season the phase change memory cells, they may be exposed to an initial pulse that exceeds the pulse duration normally applied to program a cell, and in some embodiments that pulse deviation substantially exceeds the duration of a current pulse used to program a cell. In some embodiments, the duration of the seasoning pulse may be greater than two microseconds. The amplitude in one embodiment may correspond to the amplitude of a programming current pulse. In one embodiment, the duration may be 100 times that of the programming current pulse.

The seasoning pulse may achieve equilibrium compositions of the ovonic threshold switch and the ovonic unified memory alloys, while seasoning the interfaces between electrodes in the ovonic threshold switch and the ovonic unified memory. The seasoning pulse may make the spatial distribution of elements in the phase change material more spatially uniform or the seasoning pulse may modify the composition of the phase change memory cell adjacent to an electrode of the cell. As used herein, a "seasoning pulse" is the initial pulse applied to a cell, which pulse is longer than subsequent programming pulses, or of an amplitude greater than subsequent programming pulses, the purpose of the seasoning pulse being to adjust the resistance of the cell. As used herein, a "seasoned" chalcogenide is a chalcogenide that has been exposed to a seasoning pulse.

Figure 1:
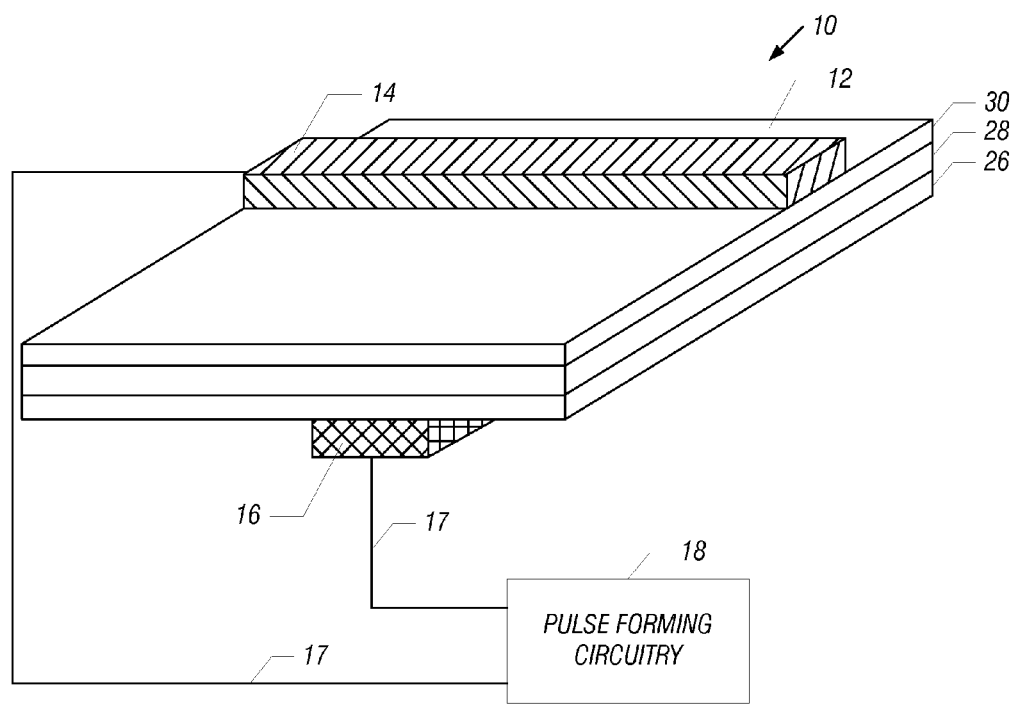
FIG. 1 is a schematic depiction of a phase change memory in accordance with one embodiment of the present invention.

Thus, referring to FIG. 1, a phase change memory 10 includes upper electrodes 14 and lower electrodes 16. The memory 10 may be part of an array of ovonic unified memory or multilevel cell memory. In one embodiment, the electrodes 14 and 16 may be elongate and the electrodes 14 may extend generally transversely to the electrodes 16.

The phase change memory core 12 may be made up of a layer of phase changing chalcogenide material 26 and a layer of amorphous chalcogenide material 30 that remains in the amorphous phase. The amorphous chalcogenide material 30 is for the ovonic threshold switch. Electrodes 28 may be provided between the amorphous material 30 and the phase changing chalcogenide 26, in some embodiments.

In order to season the memory, before a cell is programmed it may be exposed to a longer pulse. This longer pulse may be applied during wafer sort or through circuitry provided on board the memory integrated circuit. Thus, in some embodiments, pulse forming circuitry 18 may be used to provide an initial pulse that is longer than normal programming pulses. The pulse forming circuitry 18 may be on board the integrated circuit that includes the phase change memory array, as part of the row and column addressing circuitry, for example, or may be part of wafer sort equipment.

Wafer sort is also known as die sort or electrical sort. It is part of the testing of new wafers prior to release to customers and usually prior to packaging. Generally, a wafer or die may be mounted on a vacuum chuck and aligned to thin electrical probes that contact bonding pads on the unpackaged chip or wafer. The probes allow test sequences to be applied to the chip or wafer in order to determine if manufacturing specifications are met.

In the course of providing the electrical testing, longer seasoning pulses may be applied to season the memory cells. In some embodiments, the seasoning pulses may be applied before testing and, in other embodiments, they may be applied after testing. Thus, in one embodiment, where the circuitry 18 is external to the memory chip and is part of the wafer sort equipment, the lines 17 may be the probes used to contact the wafer or die under test.

Figure 2:
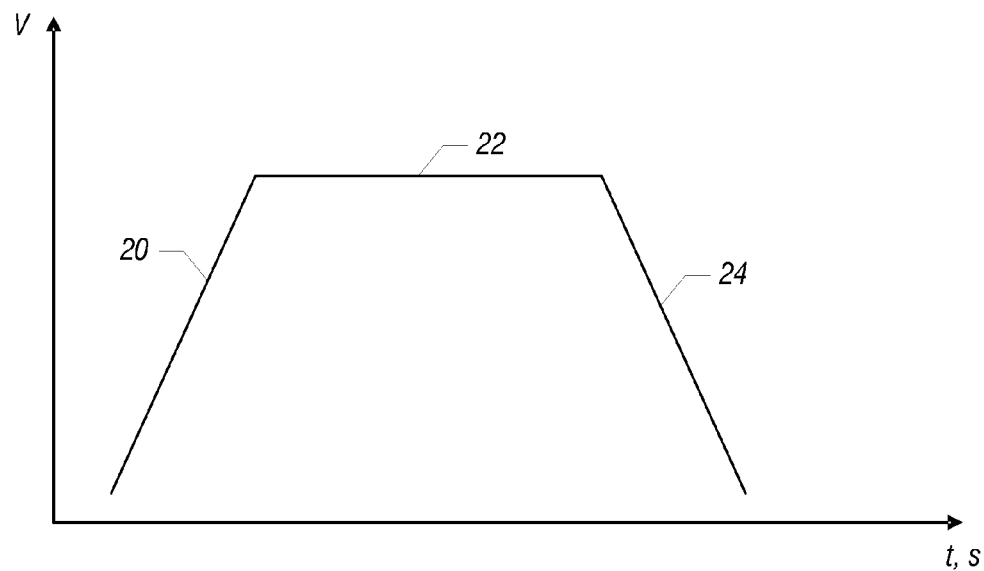
FIG. 2 is a graph of voltage versus time for a memory in accordance with one embodiment of the present invention.

Referring to FIG. 2, the seasoning pulse includes a ramp up leading edge 20, a plateau 22, and a ramp down trailing edge 24. Generally, the voltage versus time characteristics of the seasoning pulse are trapezoidal in some embodiments. In some embodiments, the plateau 22 voltage is constant.

The ramp up leading edge 20 may be relatively fast. In some embodiments, it may be less than 10 nanoseconds and the ramp down trailing edge 24 may also be fast. In some embodiments, the ramp down trailing edge 24 may be less than 10 nanoseconds. Thus, in order to make up the required pulse length, the plateau 22 may be longer when the ramp up leading edge 20 and ramp down trailing edge 24 are fast.

In another embodiment, the ramp up leading edge 20 may be slower, such as slower than ten nanoseconds. In one embodiment, the ramp up leading edge 20 may be two microseconds. The ramp down trailing edge 24 can be fast, for example, less than ten nanoseconds. The plateau 22 length is then adjusted to achieve the desired longer pulse, which is greater than two microseconds in one embodiment.

In accordance with still another embodiment, the ramp up leading edge 20 can be fast, such as faster than ten nanoseconds, and the ramp down trailing edge 24 may be slower than ten nanoseconds, for example, two microseconds, in one embodiment.

The ramp up leading edge 20 and ramp down trailing edge 22 may be slower, enabling the plateau 22 to be faster. In some embodiments, the plateau 22 may be less than ten nanoseconds if the ramp up and/or ramp down edges are sufficiently slow. In some embodiments, two or more successive seasoning pulses may be applied.

In some embodiments, the seasoning pulse causes oscillation of device resistance and device currents, particularly in devices with both an ovonic unified memory and an ovonic threshold switch. This may create transitions like those experienced as a result of sequential set and reset programming pulses.

After seasoning, the memory cells may be programmed and read conventionally.

Programming to alter the state or phase of the material may be accomplished by applying voltage potentials to the lines 17, thereby generating a voltage potential across a memory element including a phase change material 26. When the voltage potential is greater than the threshold voltages of any select device and memory element, then an electrical current may flow through the phase changing chalcogenide 26 in response to the applied voltage potentials, and may result in heating of the phase changing chalcogenide 26.

This heating may alter the memory state or phase of the chalcogenide 26, in one embodiment. Altering the phase or state of the chalcogenide 26 may alter the electrical characteristic of memory material, e.g., the resistance of the material may be altered by altering the phase of the memory material. Memory material may also be referred to as a programmable resistive material.

In the "reset" state, memory material may be in an amorphous or semi-amorphous state and in the "set" state, memory material may be in an a crystalline or semi-crystalline state. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to amorphosize memory material and "reset" memory material (e.g., program memory material to a logic "0" value). Heating the volume of memory material to a relatively lower crystallization temperature may crystallize memory material and "set" memory material (e.g., program memory material to a logic "1" value). Various resistances of memory material may be achieved to store information by varying the amount of current flow and duration through the volume of memory material.

One or more MOS or bipolar transistors or one or more diodes (either MOS or bipolar) may be used as the select device. If a diode is used, the bit may be selected by lowering the row line from a higher deselect level. As a further non-limiting example, if an n-channel MOS transistor is used as a select device with its source, for example, at ground, the row line may be raised to select the memory element connected between the drain of the MOS transistor and the column line. When a single MOS or single bipolar transistor is used as the select device, a control voltage level may be used on a "row line" to turn the select device on and off to access the memory element.

An ovonic threshold switch is either on or off depending on the amount of voltage potential applied across the switch and, more particularly, whether the current through the switch exceeds its threshold current or voltage, which then triggers the device into an on state. The off state may be substantially electrically non-conductive and the on state may be a substantially conductive state with less resistance than the off state.

In the on state, the voltage across the switch, in one embodiment, is equal to its holding voltage $V_{hold}+IR_{on}$, where $R_{on}$ is the dynamic resistance from the extrapolated X axis intercept $V_{hold}$. For example, an ovonic threshold switch may have a threshold voltage $V_{th}$ and, if a voltage potential less than the threshold voltage of the switch is applied across the switch, then the switch may remain off or in a relatively high resistant state so that little or no electrical current passes.

Alternatively, if a voltage potential greater than the threshold voltage of the select device is applied across the device, then the device may turn on, i.e., operate in a relatively low resistance state so that significant electrical current passes through the switch. In other words, one or more series connected switches may be in a substantially electrically non-conductive state at less than a predetermined voltage, e.g., the threshold voltage as applied across a switch. The switch may be in a substantially conductive state if greater than a predetermined voltage is applied across the switch.

In one embodiment, each switch may comprise a switch material that is a chalcogenide alloy. The switch material may be a material in a substantial amorphous state positioned between two electrodes that may be repeatedly and reversibly switched between a higher resistance off state that is greater than about 10 megaOhms and a relatively lower resistance on state that is about 10 Ohms in series with the holding voltage by the application of electrical current or potential.

Each switch is a two-terminal device that has an IV curve similar to that of a phase change memory element that is in an amorphous state. However, unlike a phase change memory element, the ovonic threshold switch does not change phase. That is, the switching material of the ovonic threshold switch is not a programmable material and, as a result, the switch may not be a memory device capable of storing information. For example, the switching material may remain permanently amorphous and the IV characteristics may remain the same throughout the operating life.

In the low voltage, a low electric field mode, where the voltage applied across the switch is less than the threshold voltage $V_{th}$, the switch may be off or non-conducting and exhibits a relatively high resistance (greater than about 10 megaOhms). The switch may remain in the off state until its sufficient voltage, namely, the threshold voltage, is applied or a sufficient current is applied, namely, the threshold current, that switches the device to a conductive relatively low resistance on state. After a voltage potential of greater than about the threshold voltage is applied across the device, the voltage potential across the device may drop or snapback to a holding voltage $V_{hold}$. Snapback may refer to the voltage difference between the threshold voltage and the holding voltage of the switch.

In the on state, the voltage potential across the switch may remain close to the holding voltage as current passing through the switch is increased. The switch may remain on until the current through the switch drops below a holding current. Below this value, the switch may turn off and return to a relatively high resistance, non-conductive off state, until the threshold voltage and current are again exceeded.

In some embodiments, only one switch may be used. In other embodiments, two or more series connected switches may be used.

Figure 3:
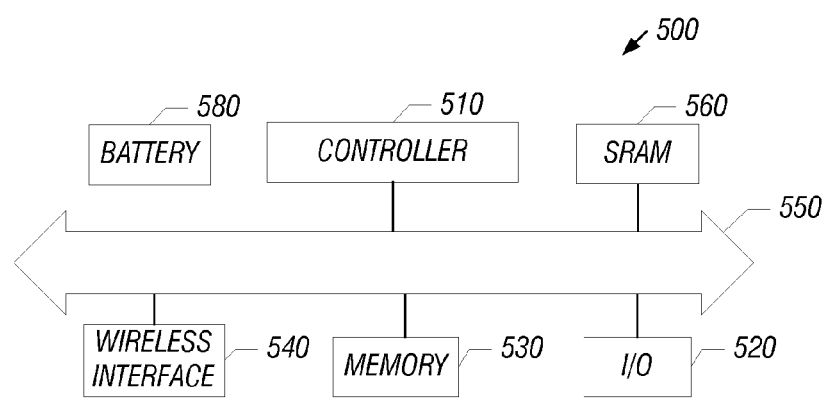
FIG. 3 is a system depiction of one embodiment of the present invention.

Turning to FIG. 3, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g. a keypad, display), static random access memory (SRAM) 560, a memory 530, and a wireless interface 540 coupled to each other via a bus 550. A battery 580 may be used in some embodiments. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a memory discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
applying a seasoning pulse to a phase change memory cell, said phase change memory cell including a phase change material, said seasoning pulse having a duration greater than two microseconds, said seasoning pulse having a voltage versus time characteristic that includes a leading edge with a ramp up time shorter than ten nanoseconds, a plateau with a plateau voltage, and a trailing edge with a ramp down time, said voltage of said seasoning pulse increasing by said plateau voltage during said ramp up time, said voltage of said seasoning pulse decreasing by said plateau voltage during said ramp down time.

2. The method of claim 1 wherein applying a seasoning pulse involves applying a pulse of longer pulse duration than programming pulses to program said cell.

3. The method of claim 1 wherein said phase change memory cell further includes an ovonic threshold switch in series with said phase change material.

4. The method of claim 1 wherein said ramp down time is shorter than ten nanoseconds.

5. The method of claim 1 wherein said ramp down time is longer than ten nanoseconds.

6. The method of claim 1 wherein said ramp up time and said ramp down time are substantially the same.

7. The method of claim 1 wherein said ramp up time and said ramp down time differ.

8. The method of claim 1 including programming said cell with a pulse of shorter duration than said seasoning pulse.

9. The method of claim 1 including applying said seasoning pulse during electrical testing.

10. The method of claim 1 including creating device current oscillation in response to applying the seasoning pulse.

11. The method of claim 1 including applying a second seasoning pulse to said cell.

12. The method of claim 1 wherein said seasoning pulse makes the spatial distribution of elements of the phase change material of said phase change memory cell more spatially uniform.

13. The method of claim 1 wherein said seasoning pulse modifies the composition of the phase change material of said phase change memory cell adjacent to an electrode of said phase change memory cell.

14. The method of claim 1, wherein said phase change memory cell lacks an electrode between said phase change material and said ovonic threshold switch.

15. The method of claim 1, wherein said plateau has a duration shorter than ten nanoseconds.

16. A method comprising:
applying a seasoning pulse to a phase change memory cell, said phase change memory cell including a phase change material, said seasoning pulse having a duration greater than two microseconds, said seasoning pulse having a voltage versus time characteristic that includes a leading edge with a ramp up time longer than ten nanoseconds, a plateau with a plateau voltage, and a trailing edge with a ramp down time, said voltage of said seasoning pulse increasing by said plateau voltage during said ramp up time, said voltage of said seasoning pulse decreasing by said plateau voltage during said ramp down time.

17. The method of claim 16, wherein said plateau has a duration shorter than ten nanoseconds.

18. The method of claim 16, wherein said ramp down time is shorter than ten nanoseconds.

19. The method of claim 16, wherein said ramp down time is greater than ten nanoseconds.

20. The method of claim 1 wherein said phase change memory cell further includes an ovonic threshold switch in series with said phase change material.

21. The method of claim 20, wherein said phase change memory cell lacks an electrode between said phase change material and said ovonic threshold switch.

22. The method of claim 1 wherein said ramp up time and said ramp down time are substantially the same.

* * * * *